US012490378B2

(12) United States Patent
Hazir et al.

(10) Patent No.: US 12,490,378 B2
(45) Date of Patent: Dec. 2, 2025

(54) VARIABLE-SPEED SWITCH MODULE HAVING A DISCRETE ON/OFF DETECTION PAD

(71) Applicant: Black & Decker Inc., New Britain, CT (US)

(72) Inventors: Sefa Hazir, Towson, MD (US); Erik A. Ekstrom, York, PA (US); Eric L. Kunz, Shrewsbury, PA (US)

(73) Assignee: BLACK & DECKER INC., New Britain, CT (US)

( * ) Notice: Subject to any disclaimer, the term of this patent is extended or adjusted under 35 U.S.C. 154(b) by 243 days.

(21) Appl. No.: 18/335,729

(22) Filed: Jun. 15, 2023

(65) Prior Publication Data

US 2024/0422903 A1 Dec. 19, 2024

(51) Int. Cl.
*H05K 1/11* (2006.01)
*H02K 11/33* (2016.01)

(52) U.S. Cl.
CPC .............. *H05K 1/111* (2013.01); *H02K 11/33* (2016.01); *H05K 2201/1009* (2013.01)

(58) Field of Classification Search
CPC ........ H02K 11/28; H02K 11/30; H02K 11/33; H02K 5/225; H02K 7/145; H02K 9/227; H05K 1/111; H05K 2201/1009; H05K 1/0213; H05K 7/1427; H05K 2201/10053; H05K 2201/10151
See application file for complete search history.

(56) References Cited

U.S. PATENT DOCUMENTS

| 8,089,019 | B2 * | 1/2012 | Inagaki | H01H 9/04 |
| | | | | 200/522 |
| 9,508,498 | B2 * | 11/2016 | Forster | B25F 5/001 |
| 10,541,588 | B2 * | 1/2020 | Wachter | B25F 5/00 |
| 10,608,501 | B2 * | 3/2020 | Ekstrom | B25F 5/008 |
| 10,651,706 | B2 * | 5/2020 | Forster | H02P 6/14 |
| 2022/0088761 | A1 | 3/2022 | Chen | |

FOREIGN PATENT DOCUMENTS

| EP | 0348679 A2 | 1/1990 |
| EP | 0894661 A2 | 2/1999 |
| EP | 3407473 B1 | 7/2021 |

OTHER PUBLICATIONS

EP EESR dated, Nov. 28, 2024 in corresponding EP application No. 24178697.9, 7 pages.

* cited by examiner

*Primary Examiner* — Jeremy A Luks
(74) *Attorney, Agent, or Firm* — Amir R. Rohani

(57) ABSTRACT

An electronic module for a powered apparatus includes a circuit board comprising conductive pads coupled to a power source and a sense portion including a first output pad and a second output pad; and a variable-speed actuator assembly including an actuator and a conductive wiper moveable in sliding contact with the circuit board. The wiper includes a first leg arranged to slidably engage the sense portion and a second leg arranged to slidably engage at least one of the conductive pads. The first output pad and the second output pad are longitudinally aligned with the conductive pads. The first output pad outputs a first voltage signal indicative of an ON state of the powered apparatus and the second output pad and the second output pad outputs a second voltage signal indicative of a desired operational speed of the powered apparatus.

20 Claims, 13 Drawing Sheets

VARIABLE-SPEED SWITCH MODULE HAVING A DISCRETE ON/OFF DETECTION PAD

FIELD

This application relates to an electronic power module, and in particular to an electronic power module in a power tool for driving a brushless DC motor.

BACKGROUND

Use of cordless power tools has increased dramatically in recent years. Cordless power tools provide the ease of a power assisted tool with the convenience of cordless operation. Conventionally, cordless tools have been driven by Permanent Magnet (PM) brushed motors that receive DC power from a battery assembly or converted AC power. In a PM brushed motor, commutation is achieved mechanically via a commutator and a brush system. By contrast, in a brushless DC motor, commutation is achieved electronically by controlling the flow of current to the stator windings. A brushless DC motor includes a rotor for providing rotational energy and a stator for supplying a magnetic field that drives the rotor. Comprising the rotor is a shaft supported by a bearing set on each end and encircled by a permanent magnet (PM) that generates a magnetic field. The stator core mounts around the rotor maintaining an air-gap at all points except for the bearing set interface. Included in the air-gap are sets of stator windings that are typically connected in either a three-phase wye or Delta configuration. Each of the windings is oriented such that it lies parallel to the rotor shaft. Power devices such as MOSFETs are connected in series with each winding to enable power to be selectively applied. When power is applied to a winding, the resulting current in the winding generates a magnetic field that couples to the rotor. The magnetic field associated with the PM in the rotor assembly attempts to align itself with the stator generated magnetic field resulting in rotational movement of the rotor. A control circuit sequentially activates the individual stator coils so that the PM attached to the rotor continuously chases the advancing magnetic field generated by the stator windings. A set of sense magnets coupled to the PMs in the rotor assembly are sensed by a sensor, such as a Hall Effect sensor, to identify the current position of the rotor assembly. Proper timing of the commutation sequence is maintained by monitoring sensors mounted on the rotor shaft or detecting magnetic field peaks or nulls associated with the PM.

Conventionally, power switches are provided within the power tool in close proximity to the motor or within the handle. Electronics including a controller for controlling the power devices are also provided within the handle or in the vicinity of the motor. A trigger switch assembly is also provided, preferable on the handle where it is easy for the user to engage. The controller is coupled to both the trigger assembly and the power devices and regulates the flow of power through the power devices based on, for example, the travel distance of the trigger assembly.

In recent years, trigger designs have been proposed that incorporate ON/OFF detection of the power tool upon initial actuation of the trigger switch and variable-speed detection into a single compact circuit and wiper assembly. The electrical contacts within such designs are, however, prone to inadvertent power tool start-up in the event metal debris contaminates the circuit and causes electrical shortage across various contact points. What is needed is a solution that ensures reliability of such designs.

This section provides background information related to the present disclosure and is not necessarily prior art.

SUMMARY

This section provides a general summary of the disclosure, and it is not a comprehensive disclosure of its full scope or all of its features.

According to an embodiment of the invention, an electronic module for a powered apparatus is provided including: a circuit board having conductive pads coupled to a power source and a sense portion including a first output pad and a second output pad; and a variable-speed actuator assembly including an actuator moveable along a movement axis and a conductive wiper moveable with the variable-speed actuator in sliding contact with the circuit board, where the wiper has a first leg arranged to slidably engage the sense portion and a second leg arranged to slidably engage at least one of the plurality of conductive pads. The first output pad and the second output pad are longitudinally aligned with the conductive pads along an axis that is parallel to the movement axis of the actuator. The first output pad outputs a first voltage signal indicative of an ON state of the powered apparatus and the second output pad and the second output pad outputs a second voltage signal indicative of a desired operational speed of the powered apparatus.

In an embodiment, at least a portion of the plurality of conductive pads is respectively coupled to a series of resistors arranged in series with the power source so the conducive pads output a varying voltage level that is coupled to the sense pad via the wiper based on a position of the actuator.

In an embodiment, the conductive pads are printed on the circuit board as a metal layer including gaps therebetween exposing the circuit board.

In an embodiment, the conductive pads include a first end pad that engages the second leg of the conductive wiper in an unactuated position of the actuator.

In an embodiment, the first end pad is coupled to a ground node of a power supply.

In an embodiment, the conductive wiper couples the first end pad to the first output pad in the unactuated position of the actuator.

In an embodiment, an actuation of the actuator causes the wiper to disengage the first output pad and engage the second output pad, causing a change in voltage in the first output pad.

In an embodiment, a gap formed between the first output pad and the second output pad includes a zigzag pattern.

In an embodiment, the module further includes an ON/OFF detection circuit mounted on the circuit board and coupled to the first output pad, the ON/OFF detection circuit outputting an activation signal that activates the powered apparatus and comprising an R-C circuit that activates the activation signal when the voltage of the first output pad stabilizes above or below a voltage threshold.

In an embodiment, as the actuator moved from a depressed position to an initial actuated position, the first voltage signal remains unchanged, but the second voltage signal exhibits a change in voltage.

In an embodiment, a further actuation of the actuator from the initial actuated position causes the first voltage signal to exhibit a change in voltage.

According to another embodiment, a power tool is provided comprising: a housing; a motor disposed in the housing; a controller configured to control a supply of electric power to the motor; and an electronic module as described above disposed partially within the housing.

In an embodiment, the controller is activated upon detection of the change in the second voltage signal, and the controller activates the motor upon detection of the change in the first voltage signal.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

Example embodiments of the present invention will become more fully understood from the detailed description given herein below and the accompanying drawings, wherein like elements are represented by like reference numerals, which are given by way of illustration only and thus are not limitative of the example embodiments of the present invention.

DESCRIPTION

Example embodiments will now be described more fully with reference to the accompanying drawings.

Figure 1:
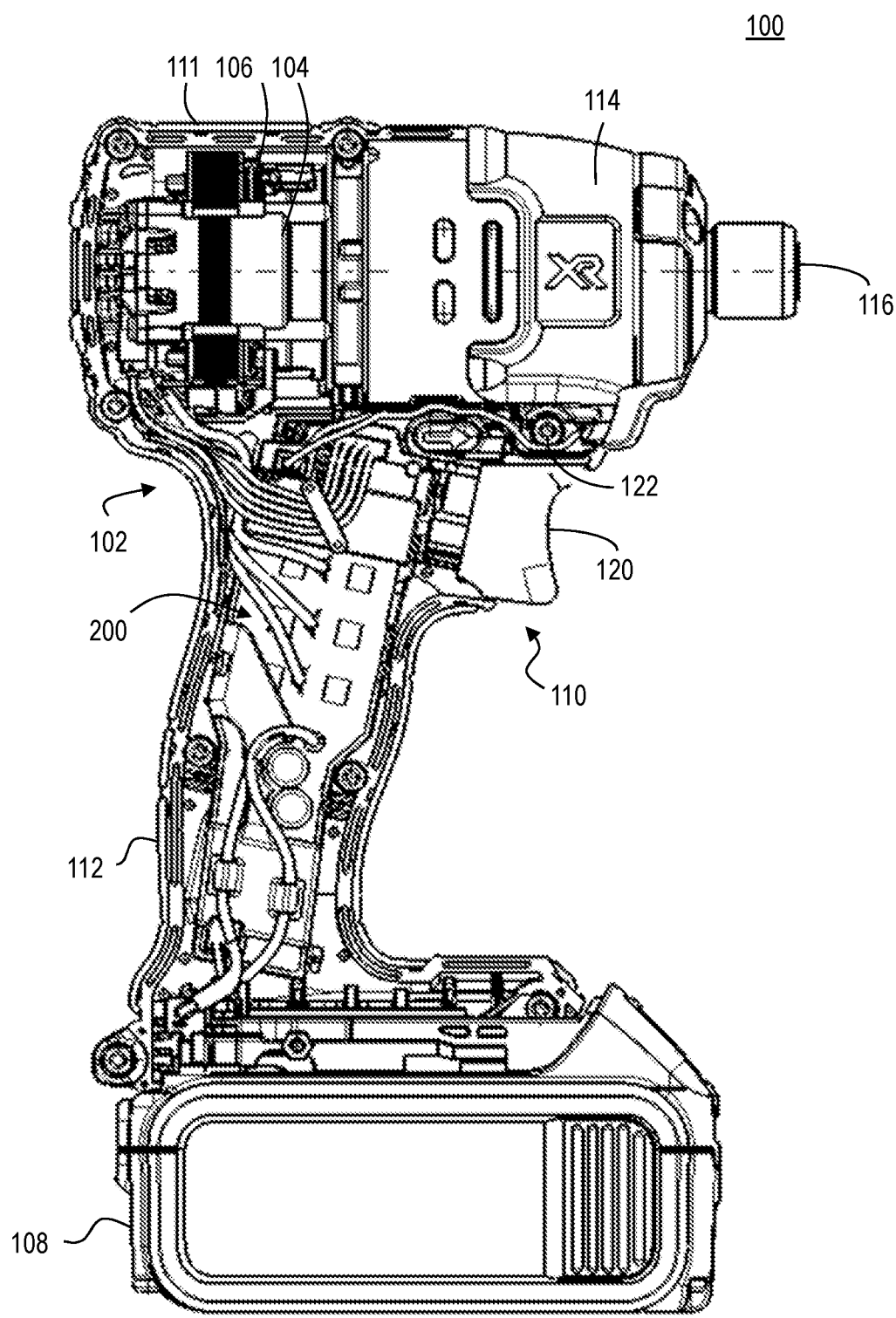
FIG. 1 depicts a longitudinal cross-sectional view of a power tool with a housing half removed, according to an embodiment.

With reference to the FIG. 1, a power tool 100 constructed in accordance with the teachings of the present disclosure is illustrated in a longitudinal cross-section view. Power tool 100 in the particular example provided may be a hand-held impact driver, but it will be appreciated that the teachings of this disclosure is merely exemplary and the power tool of this invention could be any power tool. The power tool shown in FIG. 1 may include a housing 102, an electric motor 104, a battery pack 108, a transmission assembly (gear case) 114, and an output spindle 116. The gear case 114 may be removably coupled to the housing 102. The housing 102 can define a motor housing 111 and a handle 112.

According to an embodiment, motor 104 is received in motor housing 111. Motor 104 maybe be any type of motor and may be powered by an appropriate power source (electricity, pneumatic power, hydraulic power). In an embodiment, the motor is a brushless DC electric motor and is powered by a battery pack 108.

According to an embodiment of the invention, power tool 100 further includes an integrated electronic switch and control module 200 (hereinafter referred to as "electronic control module", or "control module"). Electronic control module 200, in an embodiment, may include a controller and electronic switching components for regulating the supply of power from the battery pack 108 to motor 105. In an embodiment, electronic control module 200 is disposed within the handle 112 below the motor housing 111, though it must be understood that depend on the power tool shape and specifications, electronic control module 200 may be disposed at any location within the power tool. Electronic control module may also integrally include components to support a user-actuated input unit 110 (hereinafter referred to as "input unit" 110) for receiving user functions, such as an on/off signal, variable-speed signal, and forward-reverse signal. In an embodiment, input unit 100 may include a variable-speed trigger 120, although other input mechanism such as a touch-sensor, a capacitive-sensor, a speed dial, etc. may also be utilized. In an embodiment, an on/off signal is generated upon initial actuation of the variable-speed trigger 120. In an embodiment, a forward/reverse button 122 is additionally provided on the tool 100. The forward/reverse button 122 may be pressed on either side of the tool in a forward, locked, or reverse position. In an embodiment, the associated circuitry and components of the input unit 110 that support the variable-speed trigger 120 and the forward/reverse button 122 may be fully or at least partially integrated into the electronic control module 200. Based on the input signals from the input unit 110 and associated components, the controller and electronic switching components of the electronic control module 200 modulate and regulate the supply of power from the battery pack 108 to motor 105. Details of the electronic control module 200 are discussed later in detail.

While in this embodiment, the power source is battery pack 108, it is envisioned that the teachings of this disclosures may be applied to a power tool with an AC power source. Such a power tool may include, for example, a rectifier circuit coupled to the AC power source.

It must be understood that, while FIG. 1 illustrates a power tool impact driver having a brushless motor, the teachings of this disclosure may be used in any power tool, including, but not limited to, drills, saws, nailers, fasteners, impact wrenches, grinders, sanders, cutters, etc. Also, teachings of this disclosure may be used in any other type of tool or product that include a rotary electric motor, including, but not limited to, mowers, string trimmers, vacuums, blowers, sweepers, edgers, etc.

Figure 2A:
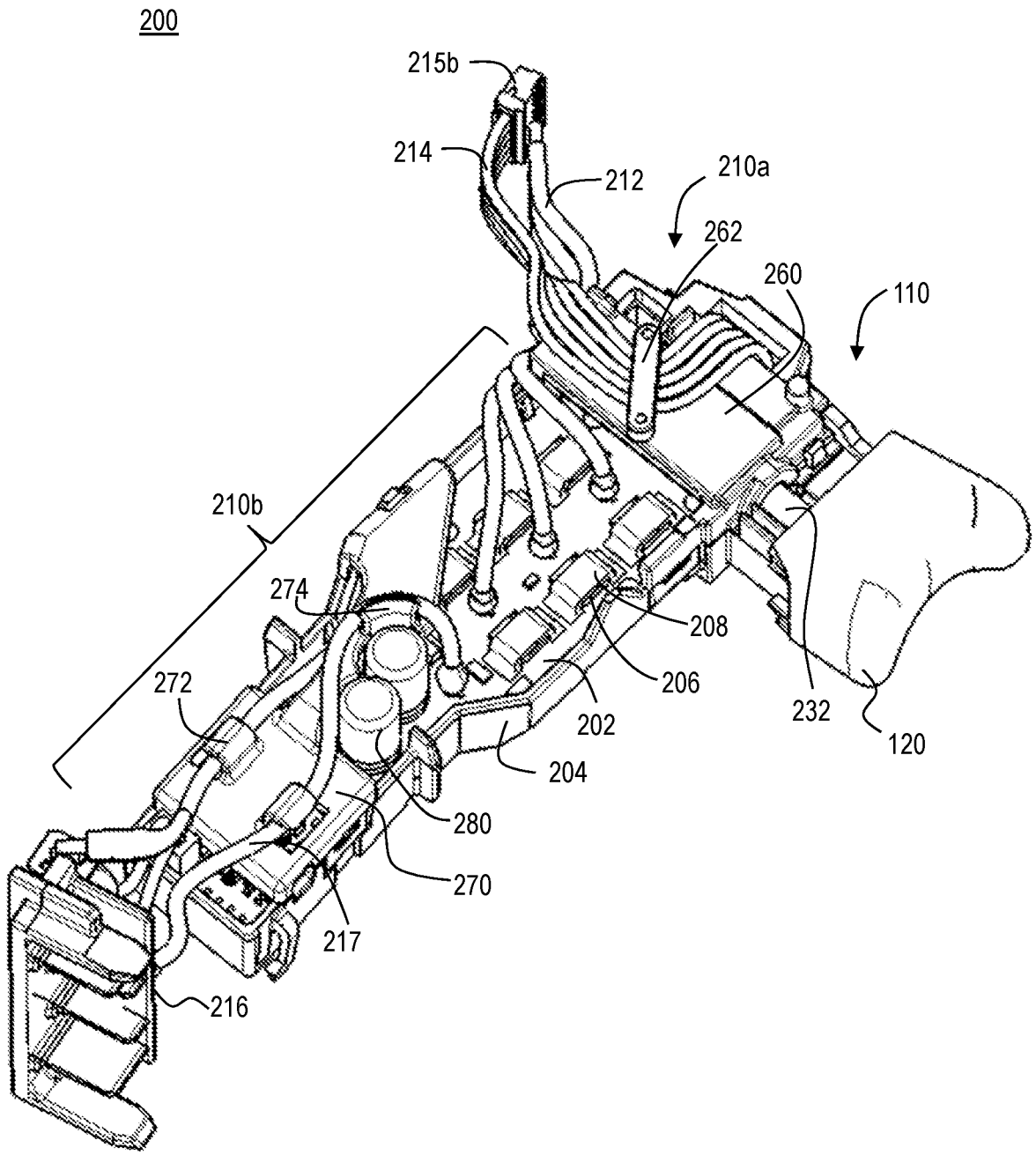
FIGS. 2A and 2B depict perspective views of an electronic control module from two different angles, according to an embodiment.
Figure 2B:
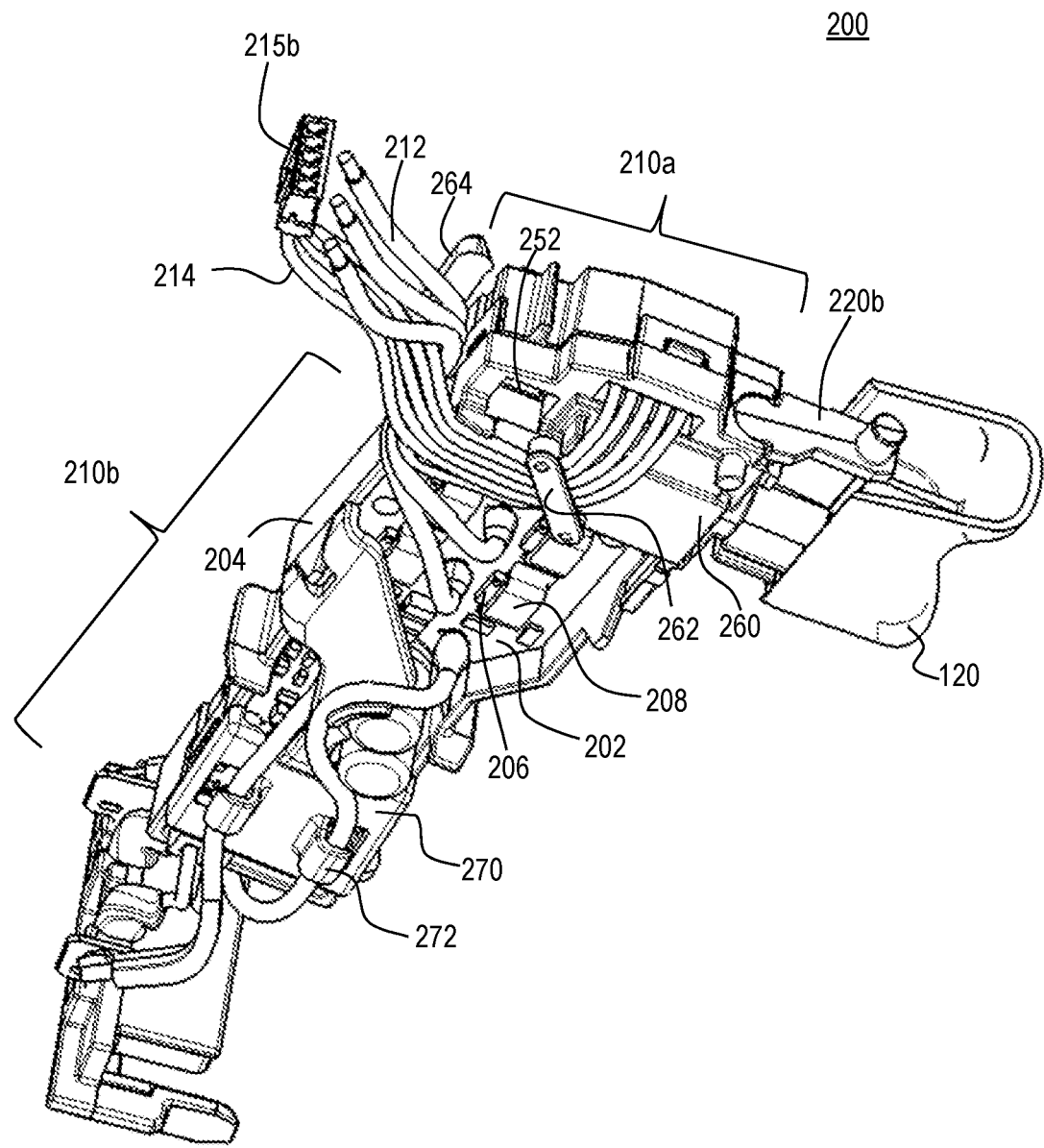

The electronic control module 200 is described herein, according to an embodiment of the invention. FIGS. 2A and 2B depict perspective views of electronic control module 200 from two different angles, according to an embodiment.

Figure 3A:
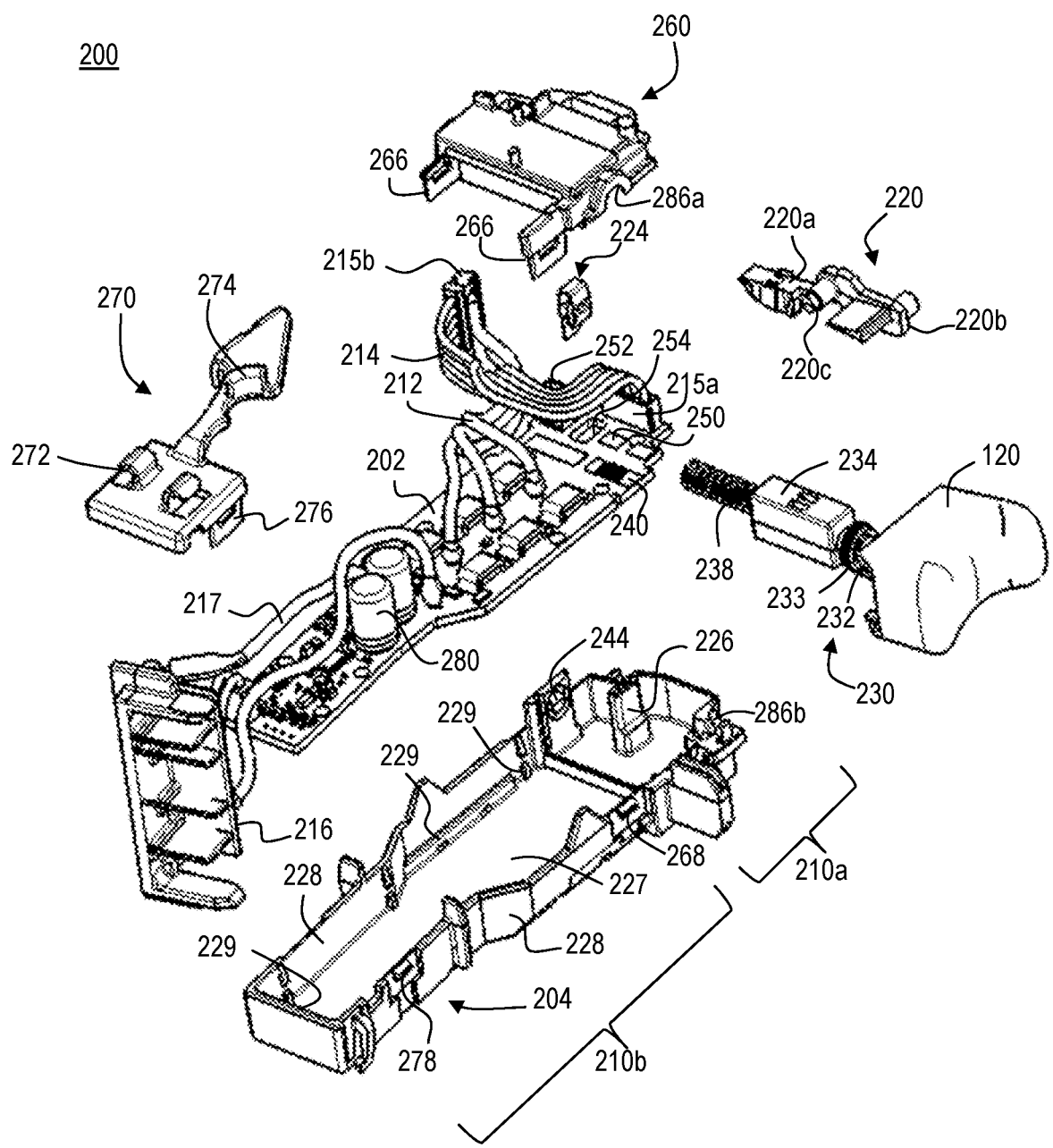
FIGS. 3A and 3B respectively depict expanded front and back perspective views of the electronic control module, according to an embodiment.
Figure 3B:
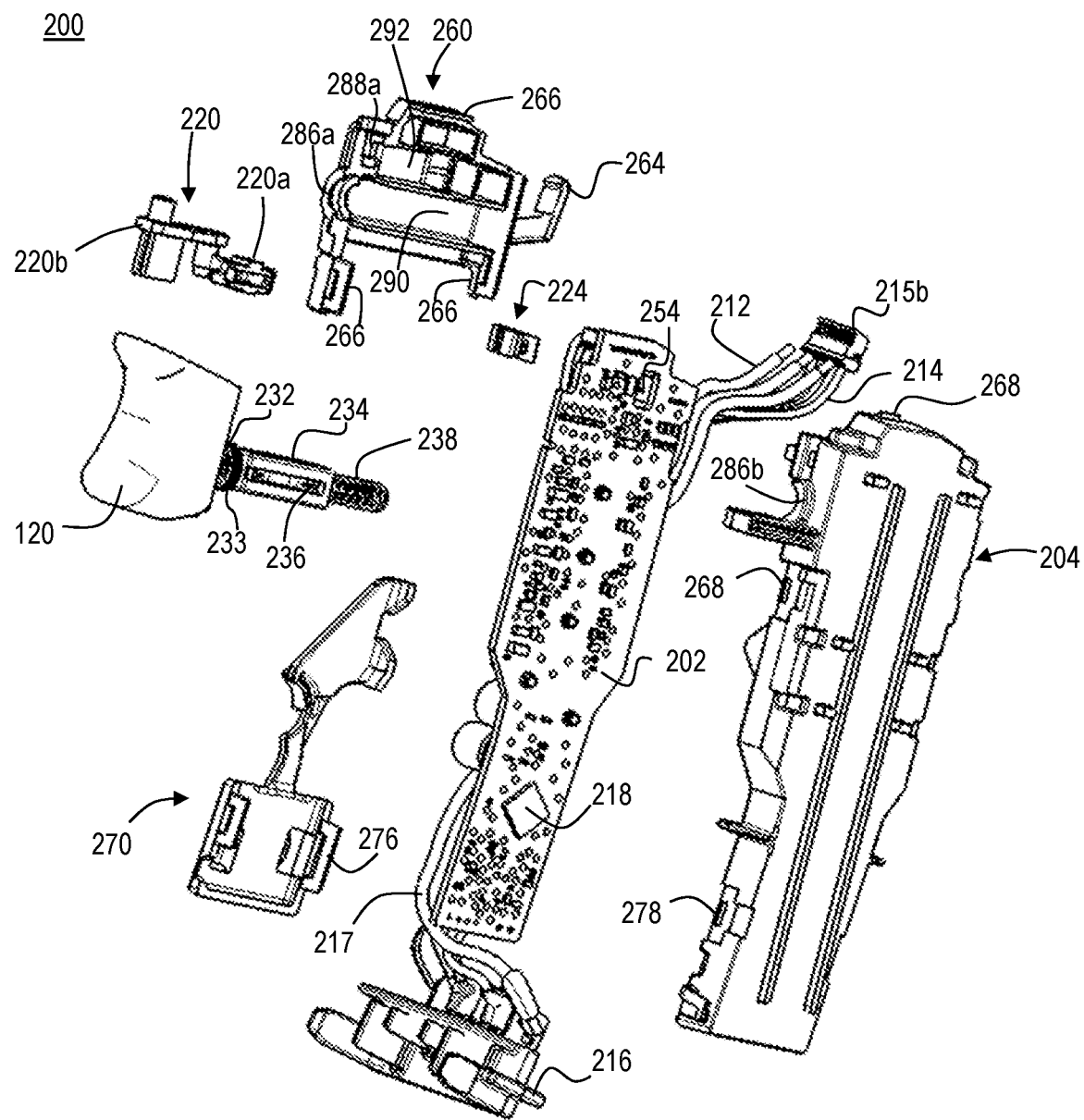

FIGS. 3A and 3B depict exploded front and back views of the same module 200, according to an embodiment. Reference is made to these drawings herein.

Electronic control module 200, in an embodiment, includes a printed circuit board (PCB) 202 arranged and mounted inside a module housing 204. Module housing 204 includes a bottom surface 227, side walls 228, and an open face. PCB 202 is inserted through the open face and secured inside the module housing 204. Side walls 228 include retention features 229 for securely holding the PCB 202 at a distance from the bottom surface 227. Control module 200 includes two compartments—an enclosed compartment 210a that houses and encloses a first part of the PCB 202 and components associated with the input unit 110, as described below, and an open compartment 210b, and partially encloses a second part of the PCB 202. Within the open compartment 210b, module housing 204 encloses the lower surface and the sides of PCB 202, but it leaves the upper surface of the PCB 202 substantially exposed. Mounted on the upper surface of PCB 202 are a series of power switches 206 and a series of heat sinks disposed over the power switches 206 and secured to the PCB 202. As discussed below in detail, this arrangement allows cooling air to transfer heat away from the heat sinks 208 within the power tool 100, but it protects the input unit 110 components from any dust and debris from the cooling air.

According to an embodiment, control module 200 includes a controller 218. In an embodiment, the controller may be mounted to a lower surface of the PCB 202 and be in electronic communication with the rest of the PCB 202 components through vias (not shown). In an embodiment, controller 218 may be a programmable micro-controller, micro-processor, or other processing unit capable of controlling the motor and various aspects of power tool. For example, controller 218 may be programmed to turn on and off power switches 206, as discussed below, to control commutation of the brushless motor. In an embodiment, controller 218 may be coupled to a series of gate drivers disposed on the PCB 202, which in turn are connected to the gates of the power switches 206. Alternatively, controller 218 may be a circuit chip that includes both a micro-controller and the gate drivers and be coupled directly to the gates of the power switches 206. Using the gate drivers, controller 218 turns the power switches 206 on or off selectively to commutate the motor and control the speed of the motor. Additionally, the controller may be programmed to various tool and battery pack operation features, such as tool and/or temperature control, battery pack voltage control, and tool over-current detection and control, etc. In an alternative embodiment, the controller may be an Application Specific Integrated Circuit (ASIC) configured to control the aforementioned aspects of the motor, battery, and power tool.

In an exemplary embodiment, power switches 206 may be Field Effect Transistors (FETs). In an embodiment, six power switches 206, including three high-side power switches and three low-side power switches, are arranged and coupled together as a three-phase bridge rectifier circuit. Using the gate drivers, controller 218 sequentially turns the power switches 206 on and off within each phase of the brush motor 104 commutation. Further, the controller 218 performs pulse-width modulation (PWM) of the power switches 206 within each phase to regulate the speed of the motor based on speed signals received from input unit 110, as described below. Controller 218 further controls the direction of motor commutation based on a forward/reverse signal received from input unit 110, also discussed below.

It is noted that while the power switches 206 discussed herein are FETs, other types of power switches such as BJTs or IGBTs may be utilized. Additionally, while power switches 206 are arranged as a three-phase bridge rectifier for driving a three-phase brushless motor, other number and arrangement of power switches may be used to drive other types of motors, including brushed or brushless motors.

As described above, module housing 204 leaves the upper surface of the PCB 202 exposed, thus allowing heat to dissipate from the heat sinks 208. Electronic control module 200 may be placed within a path of air flow inside the power tool, e.g., inside the power tool handle 112 in fluid communication with motor fan 106 so that airflow generated by motor fan 106 runs through the handle 112. The air flow generated within the handle further improves heat dissipation from the electronic control module 200.

In an embodiment, the PCB 202 is further potted with a layer of potting compound (not shown) in the open compartment 210b. The layer of potting compound, in an embodiment, substantially covers most of the circuit components on the PCB, but it leave a top plate of heat sinks 206 exposed so the heat sinks 208 can dissipate heat away from the power switches 206. While the potting compound is not shown in FIGS. 2A-3B, the control module of FIG. 1 is shows with the potting compound disposed inside the housing 202.

In an embodiment, a series of output wires 212 are secured on one end to a surface of the PCB 202. These wires connect the outputs of the power switches three-phase bridge rectifier to the power terminals the brushless motor 104. In an embodiment, a series of control signal wires 214 are also secured to a wire receptacle 215a. In an embodiment, wire receptacle 215a is mounted on the PCB and is in electrical communication with the controller 218. The control signal wires 214 allow the controller 218 to communicate with other parts of the power tool 100, such as the motor 104 and the battery 108. In an embodiment, hall signals from the brushless motor hall sensors communicate with the controller 218 through these control signal wires 214. Control signal wires 214 may additionally be provided with a control terminal 215b to ease plug-in connectivity of external wires with the control signal wires 214. In an embodiment, a pair of power input wires 217 are also secured on the surface of PCB 202. These wires are coupled to a power source (e.g., battery 108) via a power terminal 216 to supply power from the power source to the power switches 206.

In an embodiment, control module 200 includes an encapsulation member 260 that mates with the module housing 204 to form the enclosed compartment 210a of control module 200. Encapsulation member 260 protects components associated with input unit 110 from dust and debris. Encapsulation member 260 also includes wire retaining features 262 and wire guide features 264 for retaining and positioning signal wires 214 and/or power output wires 212 away from the housing 204. Encapsulation member 260 further includes mating features 266 that mate with corresponding mating features 268 on the module housing 204. In an embodiment, the mating features 268 include lips that snap fit into slots in mating features 266. In an embodiment, encapsulation member 260 further includes an opening 269 that allows control signal wires 214 to connect to PCB-side control terminal 215a.

Additionally, in an embodiment, control module 200 includes an additional cover 270 that covers a lower portion of PCB 202. Cover 270 also includes wire retaining features 272 for retaining the power wires 217, as well as wire guide features 274 for guiding the wires 217 around circuit components (e.g., capacitors 280) mounted on PCB 202. Cover 270 further includes mating features 276 that mate with corresponding mating features 278 on the module housing 204. In an embodiment, the mating features 278 include lips that snap-fit into slots in mating features 276.

In an embodiment, control module 200 is additionally provided with an auxiliary control terminal 252 mounted on a top portion of the PCB 202 that allows the controller 218 with other motor or tool components. In an embodiment, auxiliary control terminal 252 allows the controller 218 to communicate with an LED provided on the tool 100. In an embodiment, auxiliary control terminal 252 is provided outside and adjacent to the enclosed compartment 210a.

The input unit 110 is discussed herein, according to an embodiment of the invention. According to an embodiment, input unit 110 is at least partially integrated into control module 200. In an embodiment, input unit 110 incorporates electro-mechanical elements for variable-speed detection, on/off detection, and forward/reverse detection inside the enclosed compartment 210a of control module 200, as discussed herein.

In an embodiment, input unit 110 includes a forward/reverse actuator 220 supported by the enclosed compartment 210a portion of the module housing 204. In an embodiment, forward/reverse actuator 220 includes a contact member 220a, which holds an electrical connector 222 and is disposed inside the enclosed compartment 210a of the module housing 204, and an engagement member 220b, which is located outside the module housing 204. In an embodiment, engagement member 220b is in moving contact with forward/reverse button 122 on the power tool 100. A pivot member 220c located between the contact member 220a and engagement member 220b is supported by the module housing 204 and provides a pivot point for the forward/reverse actuator. A biasing member 224 is secured to the module housing 204 to engage and bias the contact member 220a in a forward, neutral (e.g., locked), or reverse direction. In an embodiment, biasing member 224 is secured in an opening of a holder, i.e. a post 226 that projects from the bottom surface 227 of the module housing 204 within the enclosed compartment 210a. In an embodiment, PCB 202 is provided with a through-hole 254 that receives the post 226. When the user presses the forward/reverse button 122 from either side of the tool to a forward, locked, or reverse position, the forward/reverse button 122 moves the engagement member 220 around the pivot portion 220c. Pivoting movement of the engagement member 220b around the pivot portion 220c causes the electrical connector 222 of contact member 220a to make or break contact with a contact-sensing member against the biasing force of the biasing member 224. In an embodiment, contact sense member includes a pair of conductive tracks 250 arranged on PCB 202.

In an embodiment, one of the conductive tracks 250 is electrically connected to power source 108 and the other is connected to and sensed by controller 218. Voltage is present and sensed by the controller 218 when electrical connector 222 makes contact with the pair of conductive tracks 250, thus electrically connecting the two conductive tracks 250. Presence or lack of sensed voltage is indicative of whether the motor should rotate in the forward or reverse direction. Functional details of use and electrical connectivity of conductive tracks 250 for forward/reserve detection are discuss in U.S. Pat. No. 9,508,498 filed May 21, 2012, which is incorporated herein by reference in its entirety.

According to an embodiment, input unit 110 further includes a variable-speed actuator 230. Variable-speed actuator includes a link member 232 that extends out of the module housing 204 from a sliding member 234 that is arranged inside the module housing 204 and supports a conductive wiper 236. Link member 232 is coupled to trigger 120 that is engageable by the user. The sliding member 234 supports and engages a compression spring 238 its longitudinal end opposite link member 232. Compression spring 238 is located between an inner wall of the module housing 204 and the sliding member 234. When the user presses the trigger 120, the sliding member 234 moves against a biasing force of the spring 238.

Conductive wiper 236 contacts a speed-sensing member located on the surface of the PCB 202. In an embodiment, the speed-sensing member is a series of variable-speed conductive tracks 240 arranged on the PCB 202. Actuation of the trigger 120 moves the conductive wiper 236 over the conductive tracks 240. Initial movement of the conductive wiper 236 over the conductive tracks 240 generates a signal that turns controller 218 ON. Additionally, an analog variable-voltage signal is generated based on the movement of the conductive wiper 128 over the conductive tracks and that signal is sent to the micro-controller. This signal is indicative of the desired motor speed. Functional details of ON/OFF and variable-speed detection using conductive tracks 240 are discuss in U.S. Pat. No. 9,508,498 filed May 21, 2012, which is incorporated herein by reference in its entirety. It must be understood, however, that any known variable-voltage speed-sensing mechanism, such as a resistive tape, may be a utilized within the scope of the invention.

It is noted that the moving mechanical parts of the forward/reverse actuator 220 and variable-speed actuator 230 (including the electrical connector 222 and conductive wiper 236), alone or in combination with conductive tracks 240 and 250, are referred to in this disclosure as "electro-mechanical" elements.

Figure 4:
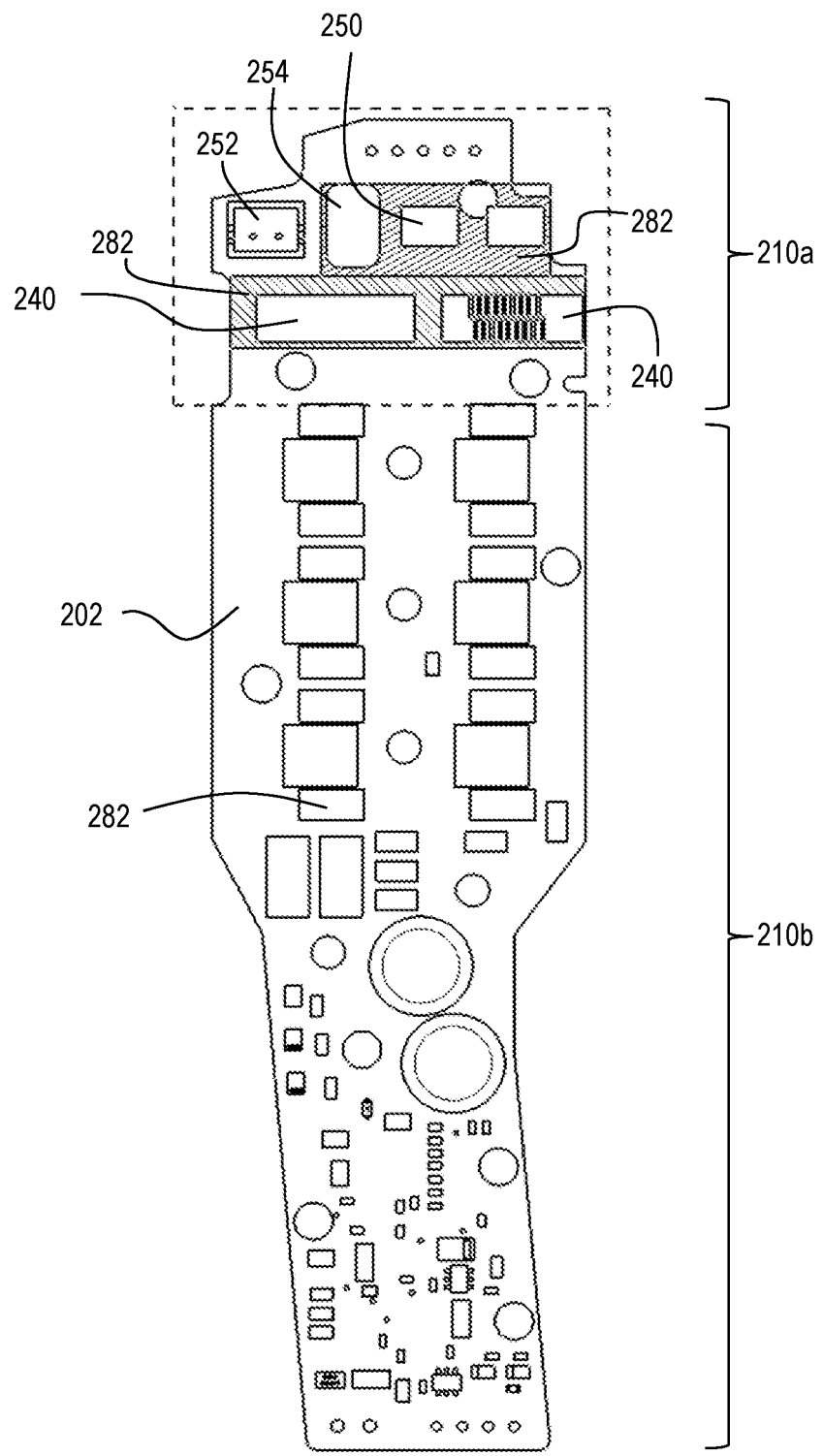
FIG. 4 depicts a top view of the PCB, according to an embodiment.

FIG. 4 depicts a top view of PCB 202 alone without any components mounted. As shown herein, PCB 202 is provided with metal traces 282 for mounting the power switches 206, as well as variable-speed conductive tracks 240 and forward/reverse conductive 250. Through-hole 254 and auxiliary terminal 252 is also shown in this figure.

In an embodiment, a layer of silicon conformal coating is applied to the PCB 202 to protect it from dust, debris, moisture, and extreme temperature changes. However, since the conductive tracks 250 and 240 need to remain exposed to make electrical contact with the forward/reverse electrical connector 222 and variable-speed conductive wiper 236, a high temperature resistant tape 284 is applied to the PCB 202 over the conductive tracks 240 and 250 before the silicon conformal coating is applied. The high temperature resistant tape 284 ensures that the silicon conformal coating does not cover the conductive tracks 240 and 250.

As described above with reference to FIGS. 3A and 3B, input unit 110 of the electronic control module 200 includes variable-speed actuator 230, which includes sliding member 234 supporting conductive wiper 236. When the user presses the trigger 120, the sliding member 234 moves against a biasing force of spring 238, and conductive wiper 236 makes slidingly contact with speed-sensing member located on the surface of the PCB 202. In an embodiment, the speed-sensing member is a series of variable-speed conductive tracks 240 arranged on the PCB 202, an actuation of the trigger 120 moves the conductive wiper 236 over the conductive tracks 240. Initial movement of the conductive wiper 236 over the conductive tracks 240 generates a signal that turns controller 218 ON. Additionally, an analog variable-voltage signal is generated based on the movement of the conductive wiper 128 over the conductive tracks and that signal is sent to the micro-controller.

U.S. Pat. No. 9,508,498 filed May 21, 2012, which is incorporated herein by reference in its entirety, described the arrangement and circuit connectivity of the variable speed conductive tracks 240 in detail (see FIGS. 10A-13C). As described in this disclosure, the conductive tracks 240 include a sense pad 160 and a series of conductive tracks 162 arranged in line with the sense pad 160. At its initial default position, the wiper 128 makes contact with pad 162(20), which is coupled to the B+ terminal of the power supply. As the trigger is pressed, the wiper moves from pad 162(20) to pad 162(19), causing a large voltage drop to be sensed on sense pad 160, which generates a signal to begin supplying power to the controller. From there, as the trigger is pressed further, the wiper moves from pad 162(19) all the way to pad 162(1) at its fully-pressed position, resulting in stepped voltage drop on the sense pad 160. The controller monitors the voltage on the sense pad 160 and controls the speed of the motor according to the voltage level on the sense pad 160.

The tips of the wiper (See e.g., tips a-d of the wiper 128 in FIG. 10A of the '498 patent) are often chamfered for smooth movement of the wiper over the conductive pads. However, due to manufacturing process or equipment failure, the wiper tips of some wipers may inadvertently include sharp edges capable of cutting into the conductive tracks and scraping off strips of metal that then get stuck between adjacent conductive pads. This is particularly problematic if the sharp edges of the wiper cut into the sense pad or the two end pads, where the travel distance of the wiper edge may be up to 10 mm. These metal strips may get struck between the conductive tracks and cause serious system failure—e.g. between sense pad 160 and end pad 162(20) in the '498 patent, in which case the tool will not turn on with trigger pull, or between the end pad 162(20) and resistive pad 162(19), in which case the tool will turn on inadvertently.

Figure 5:
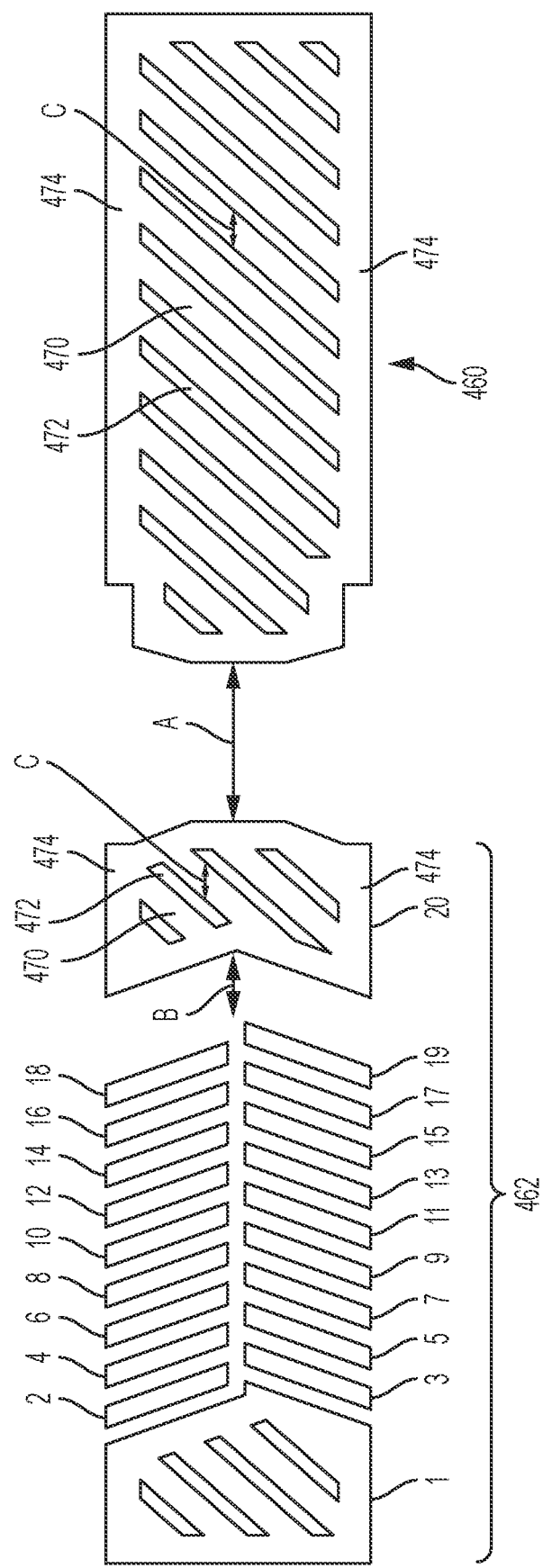
FIG. 5 depicts a top view of a conductive track arrangement including a sense pad and conductive pads of the electronic control module input unit, according to an embodiment.
Figure 6:
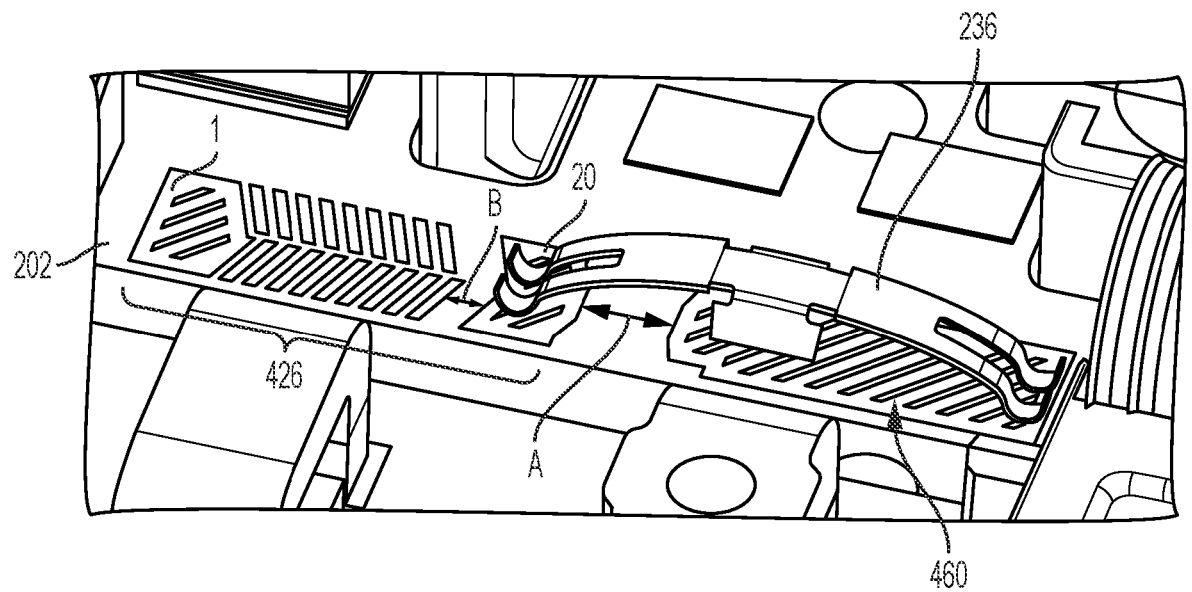
FIGS. 6 and 7 depict perspective zoomed-in views of the PCB with a wiper moving over the sense pad and the conductive pads, according to an embodiment.
Figure 7:
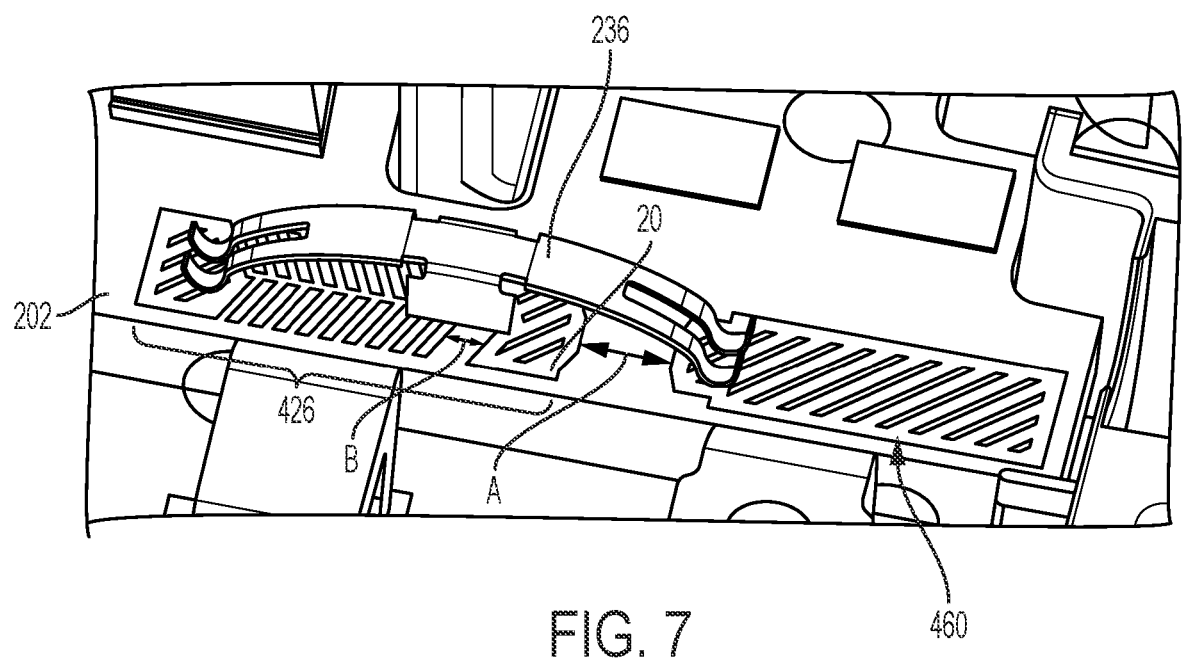

In order to overcome this problem, according to an embodiment of the invention, a segmented pad design is provided, as shown in FIGS. 5-7.

FIG. 5 depicts a top view of a conductive pad arrangement mounted on the PCB 202 including the sense pad 460 and conductive pads 462. FIGS. 6 and 7 depict perspective zoomed-in views of the PCB 202 with the wiper 236 moving over the sense pad 460 and the conductive pads 462.

As shown in these figures, sense pad 460 is partitioned into a series of segments 470 disposed on the PCB 202 with parallel linear gaps 472 therebetween. In other words, sense pad 460 is printed on the PCB 202 with linear gaps 472 so as to expose the PCB 202 between segments 470. The end pads 462(1) and 462(20) of the conductive pads 462 may similarly be segmented into a series of segments 470 with linear gaps 472 therebetween.

In an embodiment, the linear gaps 472 may be oriented diagonally with respect to an axis of movement of the wiper 236. Alternatively, linear gaps 427 may be disposed substantially perpendicularly with respect to the axis.

In an embodiment, linear gaps 427 extend from axial boundary portions 474 so as to intersect the travel path of the wiper 236 tips. As such, the boundary portions 474 electrically connect the segments 470 together.

In an embodiment, linear gaps 427 are positioned such that a width 'C' of each segment 470 along the axis of movement of the wiper 236 is smaller than distance 'A' between the sense pad 460 and the end pad 462(20). In an embodiment, distance 'C' is also smaller than distance 'B' between end pad 462(20) and the nearest conductive pad 462(19). This configuration ensures that as the wiper 236 moves along the sense pad 460 and/or the conductive pads 462, it cannot scrape off a strip of metal debris longer than the distances 'A' or 'B'. In other words, even if a piece of the sense pad 460 or the conductive pads 462 is scraped off by the wiper 236 edges, the length of the piece cannot be large enough to electrically short the sense pad 460 to the end pad 462(20), or the end pad 462(20) to the conductive pad 462(19).

Another aspect of the disclosure is described herein with reference to FIGS. 8-13, according to an embodiment.

In the above-described embodiment of FIGS. 5-7, the initial actuation of the trigger generates a signal to power the controller, but the controller does not begin to switch the inverter circuit ON until further actuation of the trigger. With this arrangement, as described above, as the trigger is pressed, the wiper moves from pad 462(20) to pad 462(19), causing a large voltage drop to be sensed on sense pad 460, which generates an ON signal to begin supplying power to the controller. The controller activates the power tool when it receives the ON signal. While this design can reliably activate the controller when the user presses the trigger, it is prone to error and inadvertent power tool start-up if a metal particle contaminates the circuit board across the gap 'B' and causes electric shortage between pads 462(20) and 462(19).

U.S. Pat. No. 11,477,889, filed Jun. 24, 2019, discloses a similar design as describe above, further provided with a power contact switch mounted on the circuit board. The power contact switch engages two conductive tracks on the circuit board to active on ON signal when the trigger switch is initially actuated. This arrangement provides an extra level of security and prevents unintentional activation of the power tool in the event of an electric shortage between the conductive tracks of the circuit board. However, the module becomes prone to mechanical failures, is more expensive to manufacture, and occupies more space.

To provide a cost-effective and reliable alternative, according to an embodiment, an alternative conductive pad arrangement 500 and an alternative circuit diagram 510 are provided, as described here with reference to FIGS. 8-13.

Figure 8:
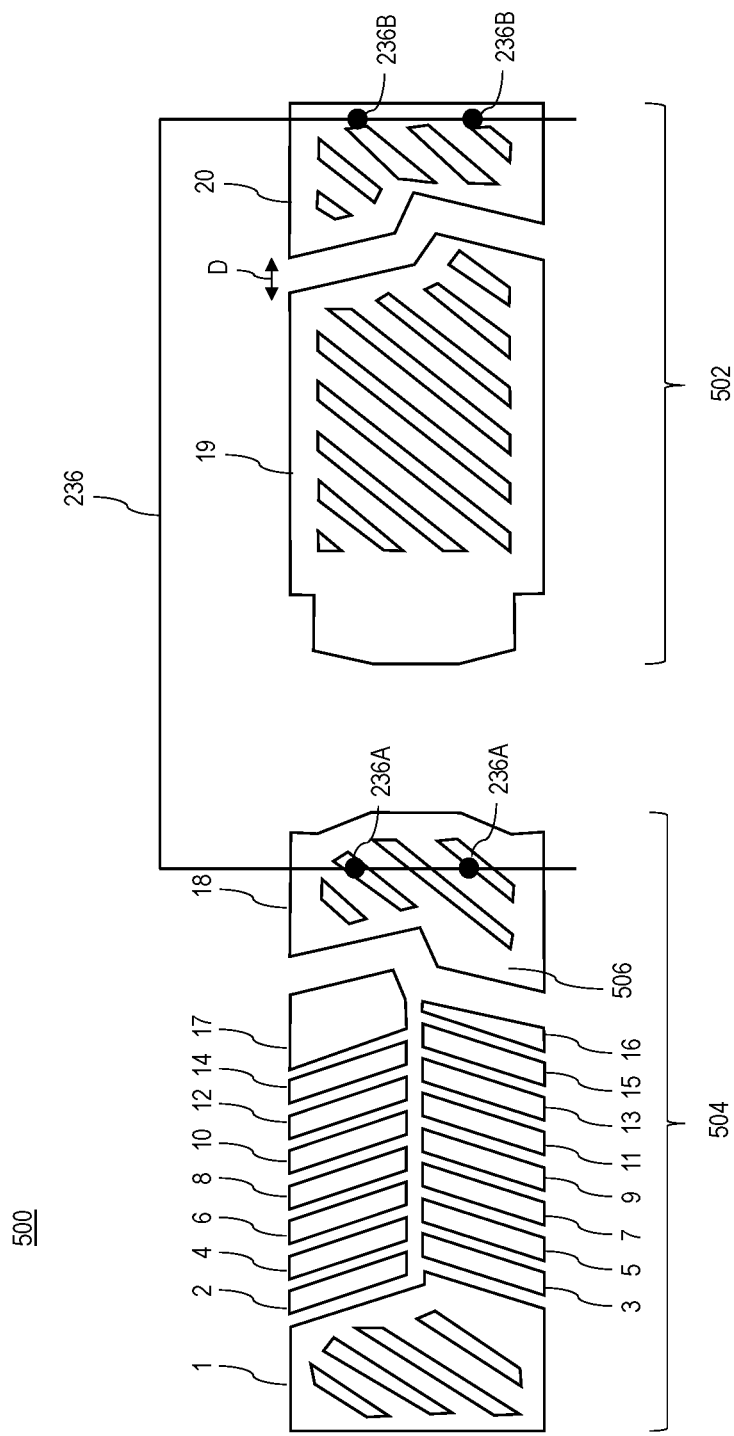
FIG. 8 depicts a top view of a conductive pad arrangement including a sense portion and conductive pads, where the trigger in its initial (unpressed) position, according to an embodiment.
Figure 9:
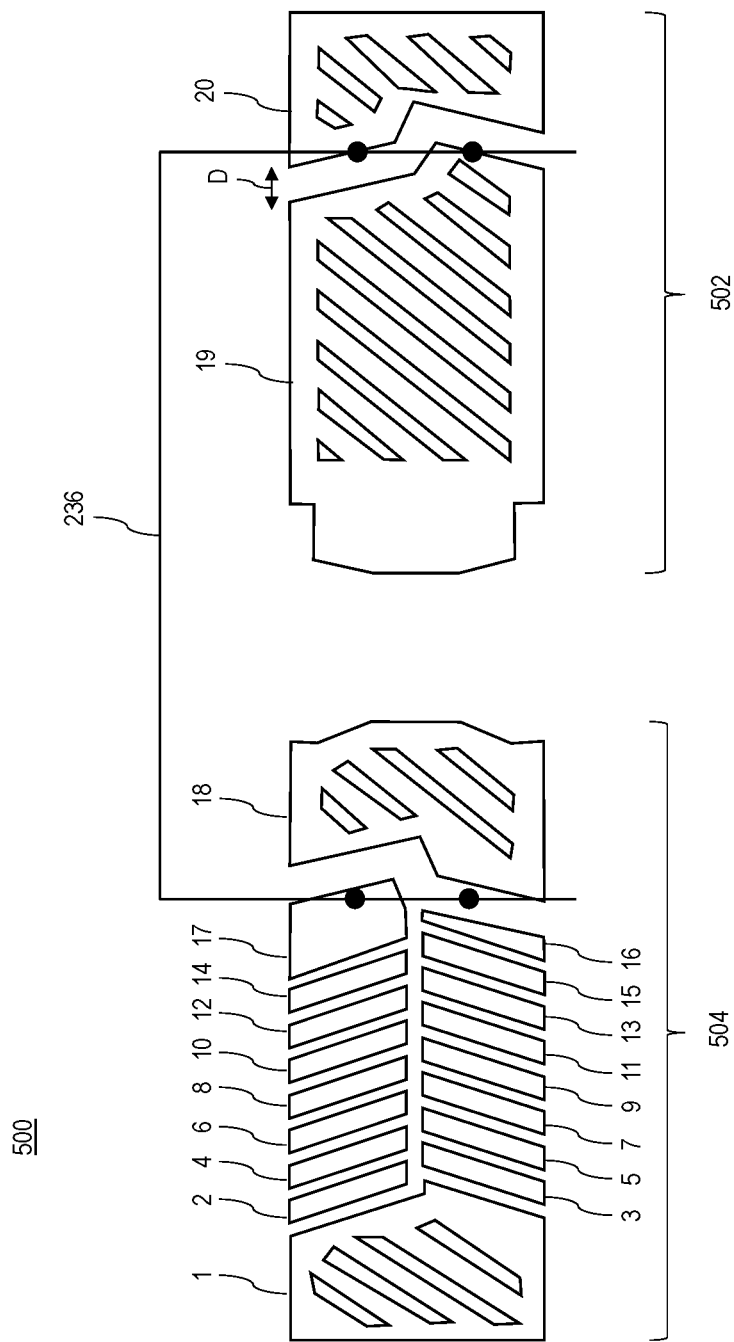
FIGS. 9 and 10 depict top view of the conductive pad arrangement with the trigger in an initially actuated position and a further depression position respectively, according to an embodiment.
Figure 10:
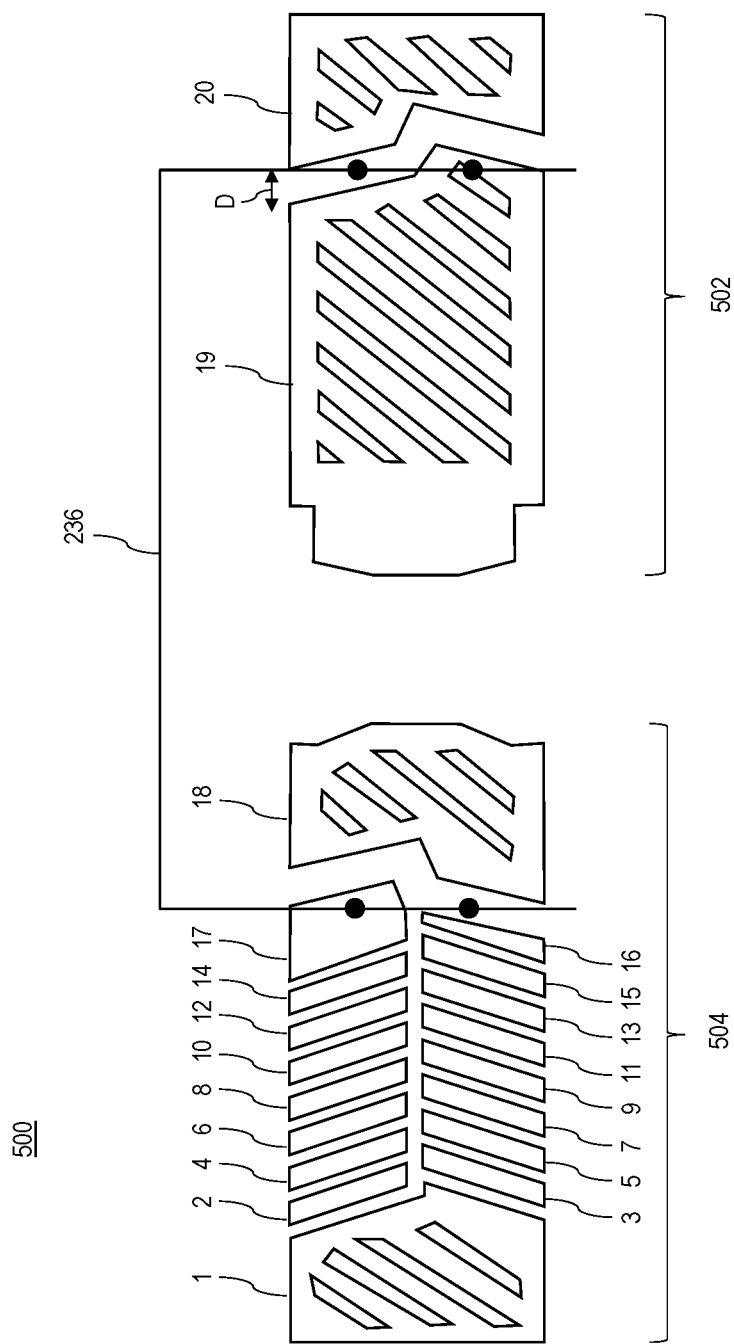

FIG. 8 depicts a top view of the conductive pad arrangement 500 mounted on the PCB 202 including sense portion 502 and conductive pads 504, where the trigger 236 in its initial (unpressed) position, according to an embodiment. FIGS. 9 and 10 depict top view of the conductive pad arrangement 500, where the trigger 236 in an initially actuated position and in a further depression position, respectively, according to an embodiment.

In this embodiment, similarly to the previous embodiment, conductive pads 504 includes a series of discrete conductive pads 504(1) through 504(18) mounted on the PCB 202, where conductive pads 504(1) and 504(18) constitute the two end pads and the remaining conductive pads 504(2) through 504(17) are provided along two arrays in a zipper pattern. Each conductive pad 504(2) through 504(17) is oriented along an angle of less than 90 degrees (e.g., approximately 55 to 75 degrees) with respect to a longitudinal axis of the conductive pad arrangement 500 (i.e. the movement axis of the wiper). As discussed, as the wiper 236 moves along the longitudinal axis of the conductive pad arrangement 500, front legs of the wiper 236 electrically engage one or more of the conductive pads 504(17) to 504(1) in a sliding manner.

In this embodiment, unlike the previous embodiment, sense portion 502 is divided into a variable-speed sense pad 502(19) that outputs a variable-voltage corresponding to the desired motor speed, and an ON/OFF sense pad 502(20) that outputs a tool ON/OFF signal. The two pads 502(19) and 502(20) are separated from one another by a gap 'D' that is greater than the axial length of individual conductive pads 504(1) to 504(15).

In an embodiment, in the initial position of the wiper 236, the wiper 236 electrically couples the ON/OFF sense pad 502(20) to conductive pad 504(18). Specifically, as shown in the illustrative example, in the initial position of the wiper 236, front legs 236A of the wiper 236 are in engagement with conductive pad 504(18) and rear legs 236B of the wiper 236 are in engagement with the ON/OFF sense pad 502(20). As the wiper 236 is moved along the longitudinal axis of the conductive pads with the actuation of the trigger switch, the front legs 236A of the wiper 236 disengage the conductive pad 504(18) and slide into contact with one or more of the conductive pads 504(17) through 504(1). Similarly, the rear legs 236B of the wiper 236 disengage the ON/OFF sense pad 502(20) and slide into contact with the variable-speed sense pad 502(19), thus electrically coupling the variable-speed sense pad 502(19) to one or more of the conductive pads 504(17) through 504(1). In this manner, the ON detection of the trigger switch (i.e., upon initial actuation of the trigger), and conversely the OFF detection of the trigger switch (i.e., upon final release of the trigger), are determined using the ON/OFF sense pad 502(20), which is discretely positioned at a long distant relative to conductive pads 504(17) through 504(1). This arrangement significantly reduces the risk of inadvertent tool start-up resulting from electric short due to contaminant metal particles.

In the illustrative example, conductive pad 504(17) occupies a greater axial length than the remaining conductive pads 504(2)-504(16) and extends past a rear edge of conductive pad 504(16) by approximately a length of a single pad. The end pad 504(18) includes a protruded portion 506 adjacent conductive pad 504(16) that extends below a rear edge of the conductive pad 504(17). This arrangement forms a gap 'E' between conductive pad 504(18) and its two adjacent conductive pads 504(16) and 504(17) including a zigzag pattern that has a substantially uniform length at least along contact points of the front legs 236A of the wiper 236. In an embodiment, gap 'D' between variable-speed sense pad 502(19) and ON/OFF sense pad 502(20) is also shaped in a zigzag pattern including a substantially uniform length at least along contact points of the rear legs 236B of the wiper 236. Thus, as the wiper 236 is moved with the actuation of the trigger switch and the legs of the wiper 236 are moved away from conductive pad 504(18) and ON/OFF sense pad 502(20), at least one of the two front legs 236A maintains contact with one of the conductive pads at all times, and at least one of the two rear legs 236B maintains contact with one of the sense pads 502 at all times. This arrangement ensures that the wiper will not be in a floating electrical state at any point, thus increasing reliability and voltage reading accuracy.

Figure 11:
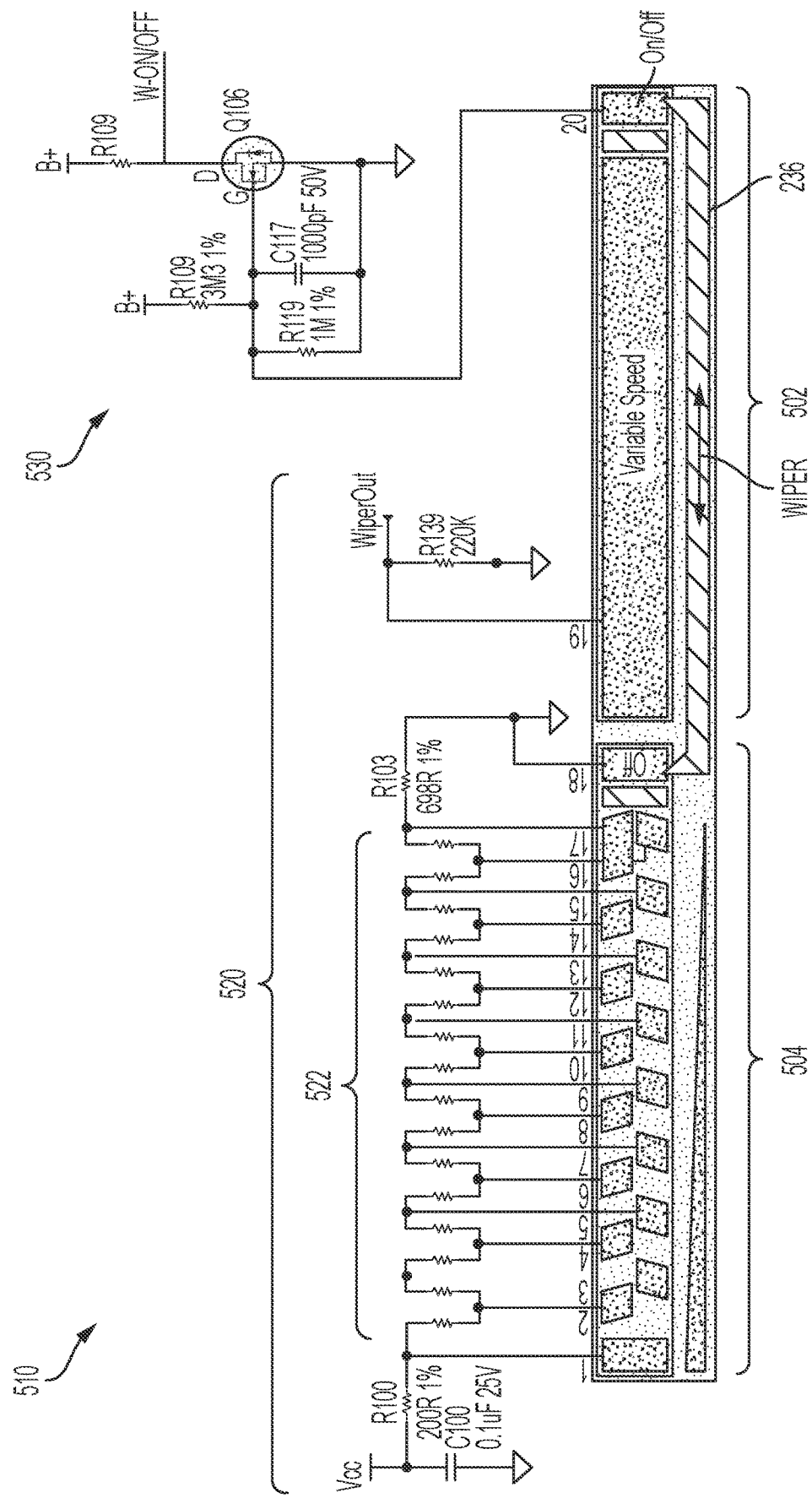
FIG. 11 depicts an exemplary circuit diagram of a variable-speed detection circuit and an ON/OFF detection circuit coupled to the conductive pad arrangement, according to an embodiment.

FIG. 11 depicts an exemplary circuit diagram 510 of a variable-speed detection circuit 520 and an ON/OFF detection circuit 530 coupled to the conductive pad arrangement 500, according to an embodiment.

In an embodiment, variable-speed detection circuit 520 includes a resistive network 522 coupled to conductive pads 504(1) through 504(17). Conductive pad 504(18) is coupled to the ground node of the power supply, while conductive pad 504(1) is coupled to a Vcc power node (in this example 3V). In this arrangement, each conductive pad 504(17) through 504(1) outputs a discrete voltage level in an increasing stepwise manner with increased trigger pull. This voltage is sensed on the variable-speed sense pad 502(19) and outputted to the controller via the WiperOut signal line.

In an embodiment, ON/OFF detection circuit 530 includes a solid state switch Q106 having a gate that is directly coupled to ON/OFF sense pad 502(20) and is further coupled to B+ node of the power supply via a resistor R109. In an embodiment, a source of the switch Q106 is coupled to the ground, and a drain of the switch Q106 is coupled to an output signal W-ON/OFF. In an embodiment, an RC circuit, including a resistor R119 and a capacitor C117 in parallel, is coupled across the gate and source of the switch Q106.

In an initial position of the wiper 236, where the ON/OFF sense pad 502(20) is coupled to the conductive pad 504(18), as shown in FIG. 8, the gate of the switch Q106 is grounded and the switch Q106 becomes open. The output signal W-ON/OFF is thus driven via resister R109 and B+ node of the power supply and is high. In this position, the WiperOut signal is grounded through resistor R139.

As the trigger switch is initially actuated, the wiper 236 couples the ON/OFF sense pad 502(20) to conductive pad 504(17), as shown in the view of FIG. 9. In this position, one leg 236A makes contact with the conductive pad 504(17) approximately as the other leg 236A becomes decoupled from the conductive pad 504(18). The gate of the switch Q106 therefore remains grounded and the switch Q106 remains open. The output signal W-ON/OFF therefore remains high. Further, the WiperOut signal becomes high due to its coupling to conductive pad 504(17). In an embodiment, in this position, the controller may become awakened due to detection of the change in voltage in the WiperOut signal, but it does not initiate motor operation as long as the output signal W-ON/OFF remained high.

As the trigger is further actuated, the wiper disengages the ON/OFF sense pad 502(20) altogether, as shown in the view of FIG. 10. In this position, since the ON/OFF sense pad 502(20) is floating, the gate of the switch Q106 is driven by the B+ node of the power supply via resistor R109. This closes the switch Q106 and couples the output signal W-ON/OFF to the ground. The output signal W-ON/OFF therefore becomes low. In an embodiment, this change in voltage in the output signal W-ON/OFF prompts the controller to begin operating the motor. Further, the WiperOut signal is driven via the resistive network of conductive pads 504(17) through 504(1) and outputs a variable-voltage signal that is correlated to the position of the trigger switch.

In an embodiment, the parallel RC circuit including resistor R1119 and capacitor C1117 control the switch Q116 operation in the event the output signal W-ON/OFF is unstable. This may happen, for example, if the tool operator rapidly feathers the trigger switch without engaging the trigger switch to an operating speed.

Figures 12, 13:
FIG. 12 depicts a waveform diagram of a control voltage of the ON/OFF detection circuit in the event of trigger feathering by an operator, according to an embodiment.
FIG. 13 depicts a waveform diagram of the output signal W-ON/OFF in the event of trigger feathering by the operator due, according to an embodiment.

FIG. 12 depicts a waveform diagram of the gate voltage of the switch Q106 without the parallel RC circuit. In this example, due to rapid trigger feathering by the operator, the gate of the switch Q106 is rapidly turned on and off. This causes a similar ripple in the output signal W-ON/OFF.

FIG. 13 depicts a waveform diagram of the output signal W-ON/OFF in the event of trigger feathering by the operator due to the smoothing effect of the parallel RC circuit. In an embodiment, the RC circuit maintains a steady low voltage at the gate of the switch Q106 even in the presents of voltage ripples until a steady high voltage above a voltage threshold V_Th is reached. It then allows the switch Q106 to close and the output signal W-ON/OFF to become low.

The proposed embodiment described in this section provides advantages over the design described in FIGS. 5-7.

While the two embodiments include the same PCB and wiper structure and comparable area for pad arrangements, the proposed embodiment provides two different outputs for speed detection and tool activation and therefore offers higher reliability. Further, the proposed embodiment ensures that the wiper is in contact with a conductive pad at any given time and does not become electrically floating at any point, which further increases reliability. Additionally, the ON/OFF detection circuit absorbs voltage ripples associated with trigger feathering or other conditions and issues an ON signal for the power tool once the trigger switch has stably reached a pressed position.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The invention claimed is:

1. An electronic module for a powered apparatus comprising:
    a circuit board comprising a plurality of conductive pads coupled to a power source and a sense portion including a first output pad and a second output pad; and
    a variable-speed actuator assembly including an actuator moveable along a movement axis and a conductive wiper moveable with the variable-speed actuator in sliding contact with the circuit board, the conductive wiper having a first leg arranged to slidably engage the sense portion and a second leg arranged to slidably engage at least one of the plurality of conductive pads;
    wherein the first output pad and the second output pad are longitudinally aligned with the plurality of conductive pads along an axis that is parallel to the movement axis of the actuator, and wherein the first output pad outputs a first voltage signal indicative of an ON state of the powered apparatus and the second output pad outputs a second voltage signal indicative of a desired operational speed of the powered apparatus.

2. The electronic module of claim 1, wherein at least a portion of the plurality of conductive pads is respectively coupled to a plurality of resistors arranged in series with the power source so the plurality of conducive pads outputs a varying voltage level that is coupled to the sense pad via the conductive wiper based on a position of the actuator.

3. The electronic module of claim 1, wherein the plurality of conductive pads is printed on the circuit board as a metal layer including a plurality of gaps therebetween exposing the circuit board.

4. The electronic module of claim 1, wherein the plurality of conductive pads includes a first end pad that engages the second leg of the conductive wiper in an unactuated position of the actuator.

5. The electronic module of claim 4, wherein the first end pad is coupled to a ground node of a power supply.

6. The electronic module of claim 4, wherein the conductive wiper couples the first end pad to the first output pad in the unactuated position of the actuator.

7. The electronic module of claim 1, wherein an actuation of the actuator causes the conductive wiper to disengage the first output pad and engage the second output pad, causing a change in voltage in the first output pad.

8. The electronic module of claim 1, wherein a gap formed between the first output pad and the second output pad includes a zigzag pattern.

9. The electronic module of claim 1, further comprising an ON/OFF detection circuit mounted on the circuit board and coupled to the first output pad, the ON/OFF detection circuit outputting an activation signal that activates the powered apparatus and comprising an R-C circuit that activates the activation signal when the voltage of the first output pad stabilizes above or below a voltage threshold.

10. The electronic module of claim 1, wherein as the actuator moved from a depressed position to an initial actuated position, the first voltage signal remains unchanged, but the second voltage signal exhibits a change in voltage.

11. The electronic module of claim 10, wherein a further actuation of the actuator from the initial actuated position causes the first voltage signal to exhibit a change in voltage.

12. A power tool comprising:
a housing;
a motor disposed in the housing;
a controller configured to control a supply of electric power to the motor; and
an electronic module disposed partially within the housing, the electronic module comprising:
a circuit board comprising a plurality of conductive pads coupled to a power source and a sense portion including a first output pad and a second output pad; and
a variable-speed actuator assembly including an actuator moveable along a movement axis and a conductive wiper moveable with the variable-speed actuator in sliding contact with the circuit board, the conductive wiper having a first leg arranged to slidably engage the sense portion and a second leg arranged to slidably engage at least one of the plurality of conductive pads;
wherein the first output pad and the second output pad are longitudinally aligned with the plurality of conductive pads along an axis that is parallel to the movement axis of the actuator, and wherein the first output pad outputs a first voltage signal indicative of an ON state of the power tool and the second output pad outputs a second voltage signal indicative of a desired operational speed of the motor.

13. The power tool of claim 12, wherein at least a portion of the plurality of conductive pads is respectively coupled to a plurality of resistors arranged in series with the power source so the plurality of conducive pads outputs a varying voltage level that is coupled to the sense pad via the conductive wiper based on a position of the actuator.

14. The power tool of claim 12, wherein the plurality of conductive pads includes a first end pad that engages the second leg of the conductive wiper in an unactuated position of the actuator.

15. The power tool of claim 14, wherein the conductive wiper couples the first end pad to the first output pad in the unactuated position of the actuator.

16. The power tool of claim 12, wherein an actuation of the actuator causes the conductive wiper to disengage the first output pad and engage the second output pad, causing a change in voltage in the first output pad.

17. The power tool of claim 12, further comprising an ON/OFF detection circuit mounted on the circuit board and coupled to the first output pad, the ON/OFF detection circuit outputting an activation signal that activates the powered apparatus and comprising an R-C circuit that activates the activation signal when the voltage of the first output pad stabilizes above or below a voltage threshold.

18. The power tool of claim 12, wherein as the actuator moved from a depressed position to an initial actuated position, the first voltage signal remains unchanged, but the second voltage signal exhibits a change in voltage.

19. The power tool of claim 18, wherein a further actuation of the actuator from the initial actuated position causes the first voltage signal to exhibit a change in voltage.

20. The power tool of claim 19, wherein the controller is activated upon detection of the change in the second voltage signal, and the controller activates the motor upon detection of the change in the first voltage signal.

* * * * *